(12) United States Patent
Hollman

(10) Patent No.: US 6,191,598 B1
(45) Date of Patent: Feb. 20, 2001

(54) HIGH RESOLUTION ANALYTICAL PROBE STATION

(75) Inventor: Kenneth F. Hollman, Carson City, NV (US)

(73) Assignee: The Micromanipulator Company, Inc., Carson City, NV (US)

( * ) Notice: Under 35 U.S.C. 154(b), the term of this patent shall be extended for 0 days.

(21) Appl. No.: 09/527,874

(22) Filed: Mar. 17, 2000

Related U.S. Application Data

(63) Continuation of application No. 09/140,910, filed on Aug. 27, 1998.

(51) Int. Cl.$^7$ .............................. G01R 1/073; G01R 31/02
(52) U.S. Cl. ............................................ 324/758; 324/751
(58) Field of Search .................................. 324/758, 158.1, 324/751, 754, 761, 762

(56) References Cited

U.S. PATENT DOCUMENTS

| | | | |
|---|---|---|---|
| 4,706,019 | * 11/1987 | Richardson | 324/751 |
| 5,493,236 | * 2/1996 | Ishii et al. | 324/751 |
| 5,530,372 | * 6/1996 | Lee et al. | 324/758 |

* cited by examiner

*Primary Examiner*—Ernest Karlsen
(74) *Attorney, Agent, or Firm*—Fitch, Even, Tabin & Flannery

(57) ABSTRACT

A method and system for probing with electrical test signals on an integrated circuit specimen using a scanning electron microscope (SEM) positioned for observing a surface of the specimen exposing electrically conductive terminals on the specimen. A carrier is provided for supporting the specimen in relation to the scanning electron microscope while a computer acquires an image identifying conductive path indicia of the surface of the specimen from the scanning electron microscope. A motorized manipulator remotely controlled by the computer manipulates a plurality of probes positionable on the surface of the specimen for conveying electrical test signals inside a vacuum chamber inner enclosure which houses the scanning electron microscope, the carrier, the motorized manipulator and the plurality of probes for analyzing the specimen in a vacuum. A feedthrough on the vacuum chamber couples electrical signals from the computer to the motorized manipulator and the plurality of probes. The computer communicates with the motorized manipulator for positioning the plurality of probes, and for applying electrical test signals to the terminals on the specimen using the image acquired by the computer to identify the electrically conductive terminals from the conductive path indicia of the surface of the specimen observed with the scanning electron microscope.

20 Claims, 4 Drawing Sheets

HIGH RESOLUTION ANALYTICAL PROBE STATION

This is a continuation, of prior application No. 09/140,910, filed Aug. 27, 1998 which is hereby incorporated herein by reference in its entirety.

BACKGROUND OF THE INVENTION

The invention relates in general to the use of high resolution microscopy for integrated circuit (IC) specimen probe stations, and particularly to methods and system for probing with electrical test signals on integrated circuit specimens using a scanning electron microscope (SEM) positioned for observing the surface indicia of the specimen identifying the electrically conductive terminals for the positioning of the probes.

Presently, probe stations typically employ optical microscopes. Although the diameters of wafers are getting larger, the structures constructed on and in those wafers are getting smaller. In the past several decades, the industry has driven the size of these structures from large sizes on the order of hundredths of an inch to small fractions of micrometers today. Until recently, most structures could be observed by normal high magnification light microscopes and probed. However, modern structures have now achieved a size that no longer allows viewing with standard light microscopes. With the industry integrated circuit design rules driving towards 0.18 micron features and smaller, most advanced optical light microscopes cannot be relied upon to accurately identify the electrically conductive terminals from the conductive path indicia of the surface of the integrated circuit specimens under test. Additionally, when viewing very small features on a specimen, the optical microscope lens often must be positioned so close to the specimen that it may interfere with the test probes.

Another approach is necessary in addition to optical microscopy if the industry is to continue to probe these structures, which is surely needed. It would be desirable therefore to provide a probe station which can visualize and probe features not typically visible under even the most advanced light microscope, that can be used in conjunction with electron optics while maintaining the features typically found on optical microscope probe stations.

SUMMARY OF THE INVENTION

It is an object of the present invention to provide probing with high resolution analytical probe stations which overcome the disadvantages and problems of the prior art.

It is another object of the invention to provide high resolution probe station methods and system for applying electrical test signals to an integrated circuit specimen.

It is further object of the invention to provide probing for positioning electrical test signals on an integrated circuit specimen using a scanning electron microscope for observing a surface of the specimen.

It is yet another object of the invention to provide a vacuum chamber in which electrical signals from a computer are coupled to motorized manipulators and a plurality of probes allowing the computer to communicate with the motorized manipulator for positioning the probes for applying electrical test signals.

Briefly summarized, the present invention relates to a method and system for probing with electrical test signals on an integrated circuit specimen using a scanning electron microscope (SEM) or a Focus Ion Beam (FIB) system positioned for observing a surface of the specimen exposing electrically conductive terminals on the specimen. A carrier is provided for supporting the specimen in relation to the scanning electron microscope while a computer acquires an image identifying conductive path indicia of the surface of the specimen from the scanning electron microscope. A motorized manipulator remotely controlled by the computer, or directly by the operator using a joystick or the like, may manipulate a plurality of probes positionable on the surface of the specimen for conveying electrical test signals inside a vacuum chamber inner enclosure which houses the scanning electron microscope, the carrier, the motorized manipulator and the plurality of probes for analyzing the specimen in a vacuum. A feedthrough on the vacuum chamber couples electrical signals from the computer to the motorized manipulator and the plurality of probes. The computer communicates with the motorized manipulator for positioning the plurality of probes, and for applying electrical test signals to the terminals on the specimen using the image acquired by the computer to identify the electrically conductive terminals from the conductive path indicia of the surface of the specimen observed with the scanning electron microscope.

Other objects and advantages of the present invention will become apparent to one of ordinary skill in the art, upon a perusal of the following specification and claims in light of the accompanying drawings.

DETAILED DESCRIPTION OF THE PREFERRED EMBODIMENTS

Figure 1:
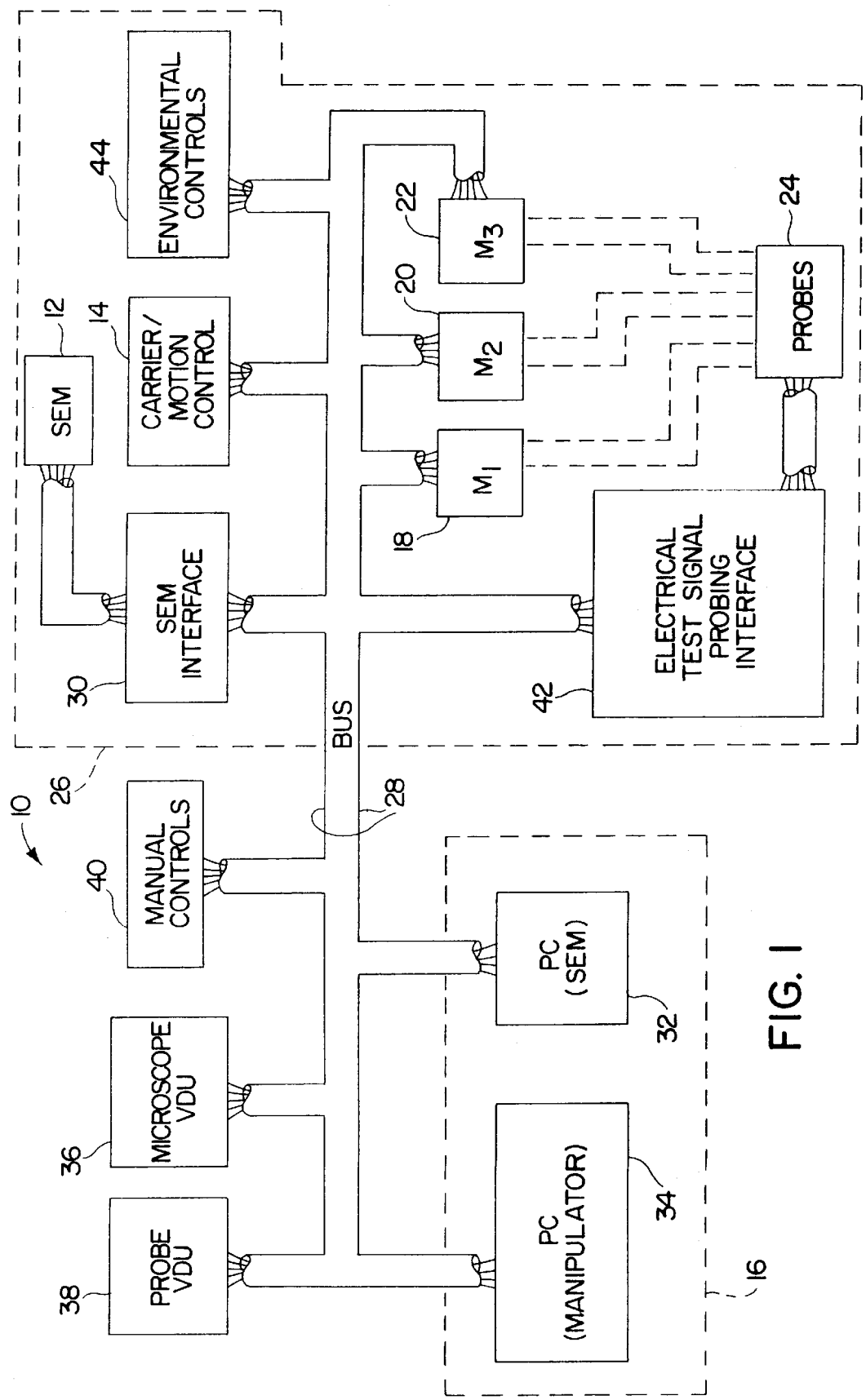
FIG. 1 shows a high resolution probe station embodying the present invention.
Figure 2:
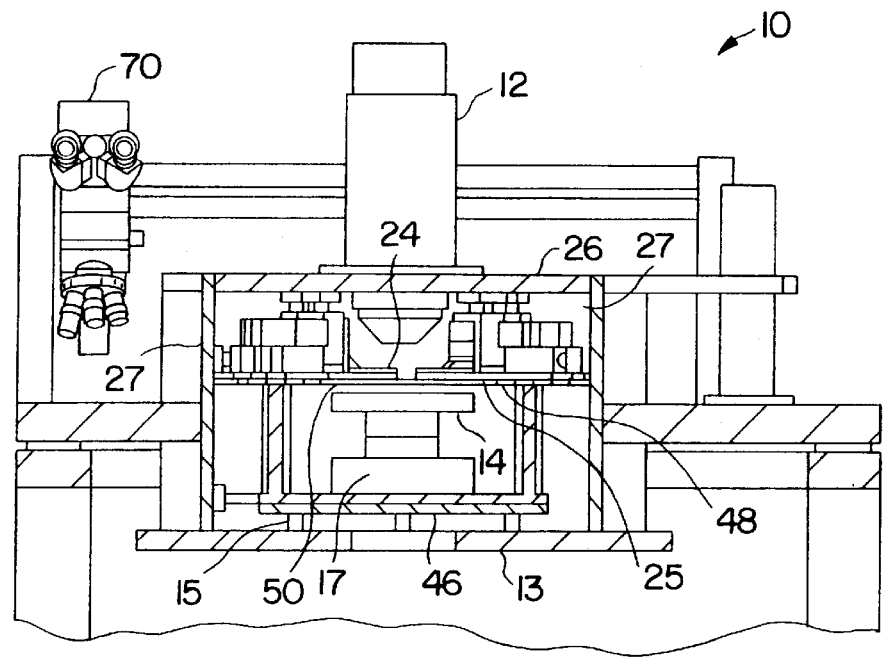
FIG. 2 shows a vacuum chamber in cross-section housing a scanning electron microscope (SEM), motorized manipulators, and a plurality of probes positioned on an integrated circuit specimen in accordance with the invention.

Referring now the drawings and especially to FIGS. 1 and 2, an system 10 is shown for high resolution analytical probing of an integrated circuit specimen, e.g., a semiconductor wafer 50, the system 10 applying electrical test signals to an integrated circuit specimen 50, which may include whole wafers, packaged parts, or wafer fragments. Thus the system 10 may probe entire wafers in addition to a large variety of similarly sized specimens. A conventional scanning electron microscope (SEM), an X-ray microprobe for material analysis during probing functions or a Focus Ion Beam (FIB) system 12 may be employed for enhanced capabilities. Thus, the prober may be integrated into FIB systems as well as SEM systems. The embodiment described herein uses a SEM provided by R.J. Lee Instruments Ltd. which is positioned for observing a surface of the specimen 50 exposing electrically conductive terminals on the specimen 50. See, e.g., FIG. 4, discussed below. The system 10 may be provided with Electron Beam Induced Current (EBIC) capabilities to allow for current path tracing tests and the like as a form of non-contact probing.

As shown in FIG. 2, a carrier 14 is provided for supporting the specimen 50 in relation to the scanning electron microscope 12. The scanning electron microscope 12 is positioned sufficiently above the specimen 50 so as to allow for the positioning of several test probes on the specimen 50, which may not be possible using an optical microscope for viewing very small circuit features. A computer system 16 is coupled to the carrier/motion control 14 in FIG. 1, and the computer system 16 further provides for acquisition of the high resolution images of FIG. 4 which identify the conductive path indicia of the surface of the specimen 50 with the scanning electron microscope 12. The computer system 16 may be provided as a processor such as a conventional microprocessor-based system, or an electronic controller, or microcontroller suitable for the information processing described below. Multiple motorized manipulators identified by reference numerals 18, 20 and 22 respectively are also remotely controlled by the computer system 16. A plurality of probes 24 are thus used for conveying the electrical test signals positionable on the surface of the specimen 50 with motorized manipulator 18, 20 and 22.

Figure 3A:
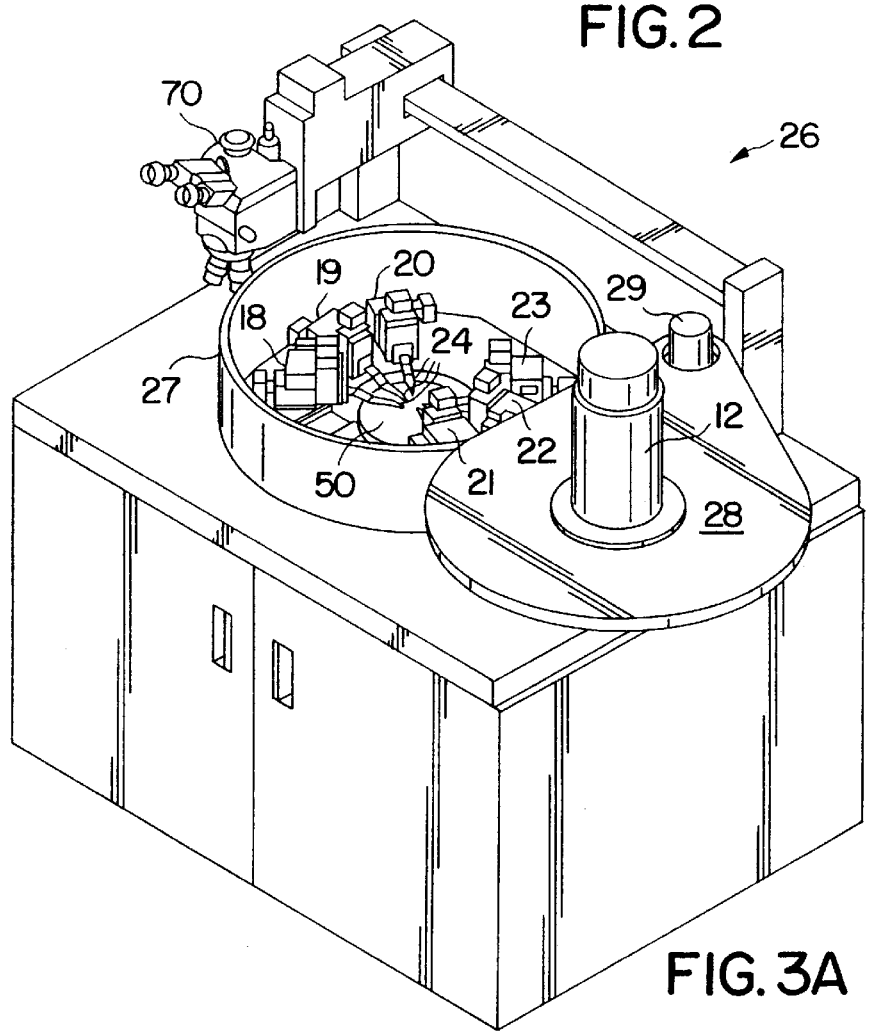
FIGS. 3A, 3B and 3C are perspective views of the vacuum chamber in which electrical signals from a computer are coupled to motorized manipulators and a plurality of probes allowing the computer to communicate with the motorized manipulator for positioning the probes for applying electrical test signals.
Figure 3B:
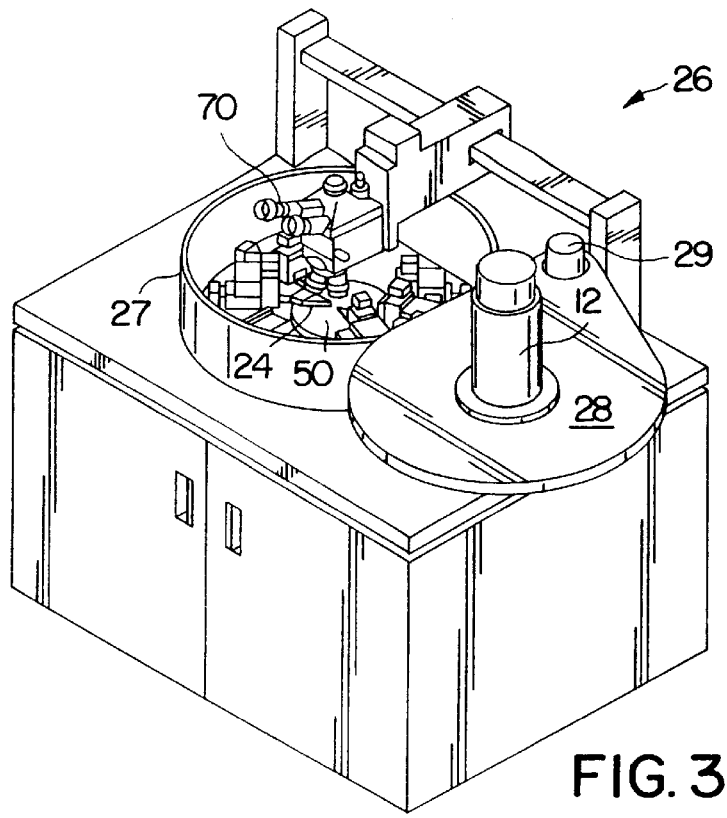
Figure 3C:
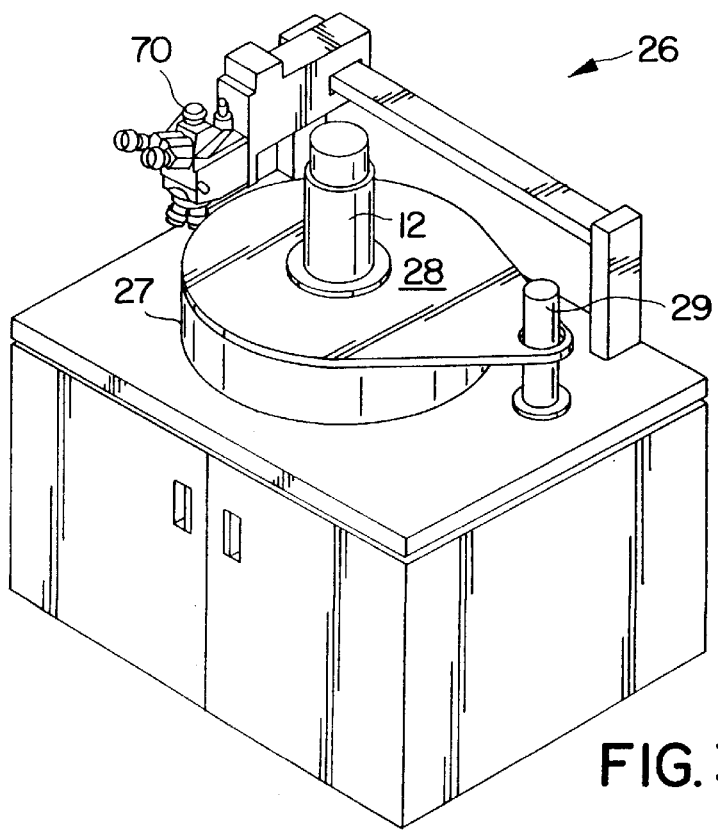

A vacuum chamber 26 shown in perspective views in FIGS. 3A, 3B and 3C illustrates system operation in which an inner enclosure 27 is adapted for housing the scanning electron microscope 12, the carrier 14, multiple motorized manipulators 18, 20 and 22, and the plurality of probes 24 for analyzing the specimen 50 in a vacuum generated by the vacuum chamber 26 for use with the scanning electron microscope 12. An angle of incidence from 45°–90° with adjustment capability in the form of different styles of replaceable probe tips, i.e., with 45° and 90° attack angles facilitates probe positioning in relation to the scanning electron microscope 12.

The chamber size of the inner enclosure 27 is dependent upon the type of probing required. A relatively small chamber is needed for small sample probing. Small samples are likely packaged parts or wafer fragments. For wafer level probing, the chamber size has to be much larger to accommodate wafer stage translations up to 300 mm and larger. The chamber is approximately 23", inner diameter×10" deep. This allows for a 6" wafer chuck having less than an inch of travel in X and Y. It also allows for up to six (6) programmable manipulators having at least 50 nM resolution and 0.5 inches of travel in all axis. The footprint of the system is approximately 3'×3'×5' which includes all of the electronics and pumping facilities required.

The system 10 is built upon a vibration isolation table provided by Kinetics Systems, which may be supplied by a variety of manufacturers. The design of this table system is customized to accommodate the vacuum chamber, which resides above and below the tabletop surface. This arrangement is made to allow easy access to the prober without having to work much above normal tabletop height. To the frame structure, a lift mechanism 29, which is either pneumatic or hydraulically driven, is employed to raise and lower the chamber top 28. Further, all of the hardware services needed for the system to function are integrated into the table leg area.

The chamber wall 27 has feedthroughs welded to it which provide flanged access for the needed cabling to both operate the programmable functions of the system as well as provide for signal paths for chuck surface 14, individual probe contacts 24 and probe card signals (not shown). A thermal chuck 14 may be employed within the system chamber. The chamber floor 13 also has feed-throughs welded to it with flanged access to attach a means of pulling a vacuum in the chamber as well as additional feedthrough ports for interconnections requirements, discussed below. Thus, the system 10 is well suited for low noise and low current testing when fitted with the described interconnection hardware and instrumentation.

A Model 900VM manipulator, the Micromanipulator Company, Inc., Carson City, Nev., is designed to meet the needs of "hands-off" operation and programmable probe applications. The manipulator 18, 19, 20, 21, 22 and 23 is motorized in the X, Y and Z axes. Z axis positioning is aided by manual, coarse positioning allowing compensation for various probe holders and probe station systems, which may be operated in a fully programmable or motorized-only (e.g., joystick control) mode depending upon the choice of controller system. The Model 900VM manipulator accepts all standard probe holders in disposable tip or integrated tip models.

At 0.05 microns, the Model 900VM manipulators offer very high manipulator resolution. This resolution is attainable with either motorized (joystick) or programmable control The 900VM also features a wide range of probe holder "Z" positioning settings, an indexed rotational nosepiece, fast manual "Z" lift for fast probe tip changes and a stable vacuum base with quick release. The model 900VM may be used with joystick only control (REM version) or with external computer control using pcProbe™ software discussed below.

A feedthrough is provided on the vacuum chamber 26 for coupling electrical signals, e.g., via a computer bus 28 from the computer system 16 to the motorized manipulators 18, 19, 20, 21, 22 and 23, stage 14 and the plurality of probes 24. The feedthroughs used are provided by PAVE Technology Co., Inc. and others that include signal, positioner and probe card connection interconnects which fall into either of two categories. The first category is those provided for DUT test signal handling capability. These can be, but not limited to single pin jack, coax, triax, SMA, and UMC connections. Further, with fixed position probe card usage, all mentioned feedthroughs may be used together plus many others meant to handle large quantities of leads. The second category is that which is dedicated to providing control signals to all of the prober functions needed. A typical axis of control may require seven leads for motor step and direction as well as limits controls with respect to travel.

Further, additional leads may be used where position feedback is employed. Kelvin probes and probe holder configurations that can be adapted to this application. These would require double the number of signal leads. The computer system 16 communicates with the motorized manipulators 18, 20 and 22 for positioning the plurality of probes 24 for applying the electrical test signals to the terminals on the specimen 50 using the image acquired by the computer system 16 to identify the electrically conductive terminals from the conductive path indicia of the surface of the specimen 50 observed with the scanning electron microscope 12.

As described, the probe station system 10 positions the scanning electron microscope 12 for observing a surface of the specimen 12 for positioning the probes 24. The system 10 provides means for supporting the specimen 50 which include the carrier/motion control 14, and a chuck for supporting the specimen 50. The fully configured prober with chuck, probe card adapter, six or more programmable manipulators, stage and platen 25 translation and measurement signal paths could require 126 or more feedthrough connections for the system requirements. At least five signal paths are used for stage surface and probes and as many as needed for probe card based connections. Kelvin probes and probe holder configurations may double the number of interconnections.

With reference to FIG. 2 and FIG. 3A, once the chamber top 28 is raised, it may be rotated out of the way such that optical microscope 70 may be moved into position over the wafer chuck 14 by sliding on the microscope bridge 71 to facilitate the initial positioning of probes over the DUT 50 in the area of interest to the user. This is done to decrease the time spent locating areas to be probed on the DUT once the system is under vacuum. Having completed this, the optical microscope 70 can be positioned out of the way so that the chamber top 28 may be lowered into place. There may be two tapered pins (not shown) that will drop into bushings appropriately placed such that the chamber top 28 with SEM column 12 may properly align with the chamber wall 27 perfecting a seal. With the SEM embodiment of system 10 as described above, hot cathode electron emitter techniques may be used, however an alternate embodiment of the system 10 may use field emission, as discussed above. Field emission provides improved image quality with much less potential for damaging the specimen 50. Further, the chamber top 27, by means of the alignment pins, should ensure that the SEM column 12 will be properly positioned amidst the probes 24 and manipulators 18–23.

Within the chamber 26, there is a motorized X-Y Prober Platform 46 which will support all of the normal prober functions as described below. The purpose of this platform 46 besides being a support structure is that of translating all of the prober functions in unison to simulate the typical microscope translation found on most probing stations today. The X/Y translation provided by the platform 46 facilitates large area DUT viewing without disturbing the probes 24. Since the column cannot move easily independent of the stage, platen, and manipulators, moving the platform allows the user to scan the DUT for sites to probe or to check the position of each probe or all of the probes provided by a probe card, which an approach unique to this function. The platen 25 may be used to simultaneously raise the manipulators and move a fixed position probe card which may be used. Thus, the tip/tilt functions provided by the motorized tilt axis 15 with the platen 25 allows vertical movement for alternate view of the probes 24 and the probe positioning on the specimen 50.

Below the platform 46 and between the platform and the bottom of the chamber 26 is a function used for tilting the platform in the "Z" direction vertically with the motorized tilt axis 15. This function allows the platform 46 to be tipped or tilted along either the "X" or "Y" axis to allow the user to observe the probe 24 making contact with the DUT 50 from an angle other than vertical. The motorized tip and tilt functions improve the probe-viewing angle. This aids the user in "seeing" touchdown on very small DUT structures.

Attached to the platform is an X-Y stage 17 with Theta adjust provided for the stage 17 for the wafer chuck 14. The method of DUT attachment to the wafer chuck is by mechanical means. Thus, a spring clip arrangement which secures the wafer to the chuck. In a vacuum chamber, vacuum, as a method of hold down, will obviously not work. The wafer sets into a slight depression with alignment pins for registration with the notches or flats typically found on most wafers today.

Also attached to the platform 46 is the "Z" platen 25 which supports both fixed probe cards and micromanipulators. The platen is motor driven in the "Z" axis such that either fixed position probe cards and/or single probes may be raised and lowered simultaneously. This controlled motion provides for probe and probe card "Z" positioning.

Multiple motorized/programmable micromanipulators 18–23 set on top of the platen 25. The supplied drawing indicates six of these devices. While six is the likely a practical limit, any number may be used to direct probes into contact with the DUT as required.

The scanning electron microscope 12 is coupled to the computer system 16 with a scanning electron microscope interface 30, which may be used with CAD navigation software. The computer system 16 thus communicates via the bus 28 to the scanning electron microscope 12 through a SEM interface 30 includes means for acquiring the image comprises a first computer.

The computer system 16 may include a first computer 32, such as a general purpose personal computer (PC) configured as a digital image processor for acquiring the images from the scanning electron microscope 12. The computer system 16 may also include a second personal computer 34 for remotely controlling the plurality of probes 24 via the motorized manipulators 18, 20, 22 which are remotely controlled by the computer 34. Alternatively, the computer system 16 may be a single PC or server which performs control operations for both the prober functions and the microscope functions. The computer system 16 may also include two computers and three monitors in the prototype version, all of which may be accomplished with a single computer and monitor. It was found however that having two monitors, one for high-resolution viewing and one for all of the system control and navigation functions was advantageous in the described embodiment.

Separate video display units (VDUs) 36 and 38, which may be provided as conventional PC computer monitors are used for displaying high resolution microscope images and computer graphics relating to the SEM 12 and probes 24, respectively. The VDUs 36 and 38 are used to visually assist a user in remotely controlling the plurality of probes 24 for placement on the specimen 50 by acquiring the images which convey information to the user relating to particular integrated circuit surface indicia corresponding to the exposed electrically conductive terminals of the specimen 50. Micromanipulator Company, Inc., Carson City, Nev., pcProbeII™ software (PCPII) used with a Windows™ based personal computer provides functions such as auto planarity compensation, auto alignment and setup which automatically guides the occasional user through the process of getting ready to probe. Manual controls 40, e.g., a mouse and/or joystick are also used by the user to control the plurality of probes 24 being placed on the specimen 50. An electrical test signal probe interface 42 is coupled to the probes 24 for applying the electrical test signals to the specimen 50. Alternatively, the plurality of probes 24 may be provided as a fixed position probe card for applying the electrical test signals to the specimen 50.

The PCPII probe software used with the computer system 16 provides a probe positioning system having control capabilities in the form of a simplified intuitive icon-based tool kit. The PCPII probe software is designed in a modular format allowing for wafer mapping, die and in-die stepping, multiple device navigation options and touchdown sense. The PCPII probe features include on-screen video with an active navigation control, advanced alignment and scaling functions and programming through wafer map, interactive learning and matrix mode. The PCPII probe navigation software supports Windows, DDE, RS-232 and GPIB interfaces. The PCPII probe navigator module provides interactive device management for controlling four or more manipulators, the specimen carrier stage, platen and the microscope.

While analyzing the specimen 50 using the probes, the navigator display shows the position and control information for the active specimen device. The navigator module also provides system operation data and probe touch-down parameters. The wafer mapping module provides a continuous visual indication of the die selected, and displays the exact coordinates of the die specimen. The PCPII probe software also includes a video module for real-time imaging of the specimen 50 with the personal computer. Each PC/probe II module uses a separate application window, which allows the user to tailor the viewing screen by defining the placement of each module and minimizing or maximizing each window individually.

Environmental controls 44 are provided for, among other things, controlling the temperature and for generating the vacuum in the inner enclosure 27 of the chamber prober housing for operating the scanning electron microscope 12, and for analyzing the specimen 50 under controlled environmental conditions in a vacuum. The environmental controls 44 may include, e.g., first as with most E-beam optical systems, magnetic shielding without which, the beam may not be properly collimated for proper resolution. Second, as the wafer probing area is completely enclosed by metal, the user will experience significant electromagnetic shielding characteristics that are an improvement over current conventional probe stations. An additional layer of insulator with a metalized surface may be employed for shielding the chuck surface 14 and provides a low noise environment. Additionally, the use of isolated coax connections will allow for triaxial measurements when the chamber is connected to ground. Next, because the probing function occurs in a vacuum, frost formation during low temperature probing applications may be nonexistent. Since little air is present, probes will not oxidize during ambient and elevated temperature applications. Finally, a thermal chuck employed with system 10 provides that the DUT may be tested at temperatures above and below ambient.

A bench style table was used for supporting VDU monitors, keyboards, mouse and joystick. The chamber for a 200 mm system is on the order of about 2'×2'×1' +/− and approximately 3'×5'×1' for a 300 mm system. The pumping elements for the larger chambers may require additional space.

Figure 4:
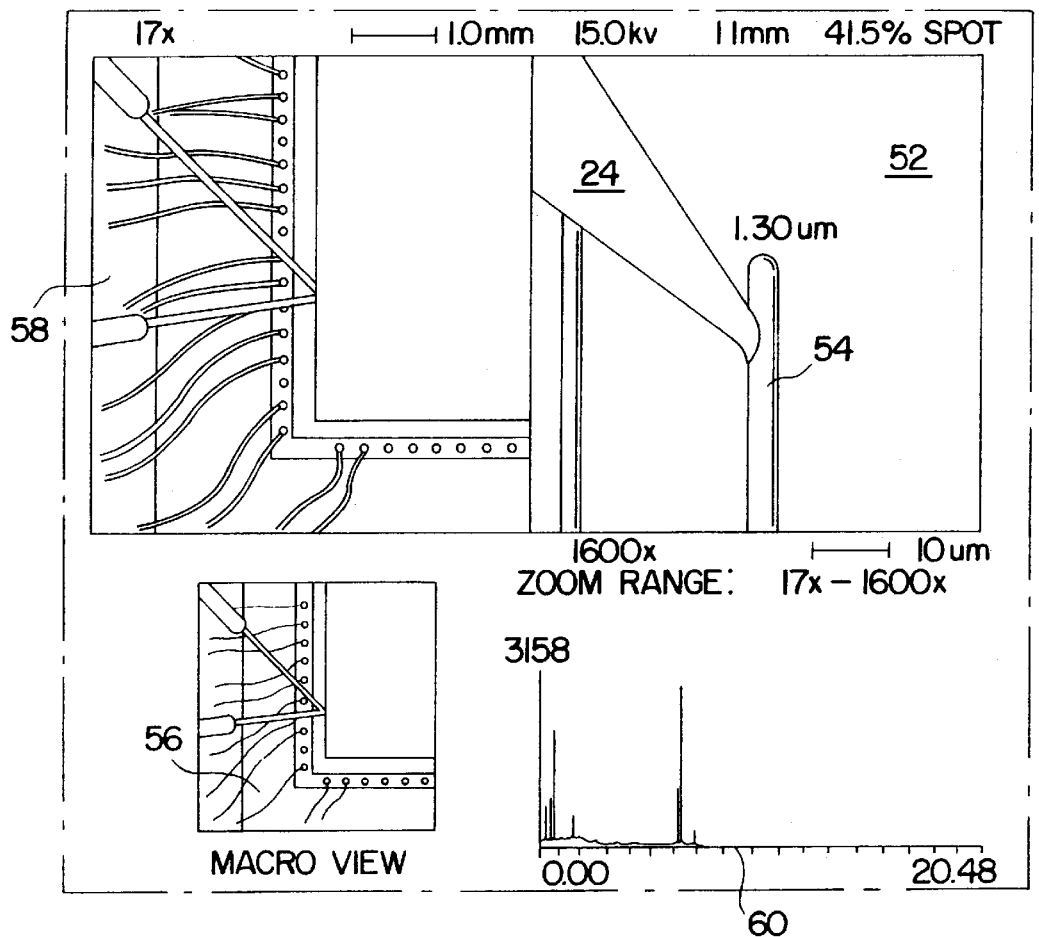
FIG. 4 is a SEM photograph showing probe positioning providing electrical test signals to an integrated circuit specimen showing the specimen surface indicia and plural probes.

Turning now to FIG. 4, a SEM photograph is shown with multiple views 52, 54 and 56 of probe 24 positioned on the specimen 50 at an exposed electrically conductive circuit path 54 as a method of providing the electrical test signals at the integrated circuit. The method of analyzing the integrated circuit specimen 50 acquires the image identifying conductive path indicia of the surface of the specimen from the scanning electron microscope 12, which are driven by the pcProbeII software interface. The pcProbeII navigation software facilitates the process of positioning the probes 24 within the high resolution image of the specimen 50. Thus, the image acquiring step is used to identify the electrically conductive terminals from the conductive path indicia 54 on the surface of the specimen 50 observed with the scanning electron microscope 12 for positioning the plurality of probes with the step of remotely controlling the plurality of probes, as discussed above. The lowest magnification view is item 56, the intermediate magnification view is item 58, and the highest magnification view is item 52. The reason for the three views is to assist the operator in maintaining a good viewpoint of just where they are working.

While there has been illustrated and described a preferred embodiment of the present invention, it will be appreciated that modifications may occur to those skilled in the art, and it is intended in the appended claims to cover all those changes and modifications which fall within the true spirit and scope of the present invention.

What is claimed is:

1. A probe station system for applying electrical test signals to an integrated circuit specimen, comprising:
    platform means for positioning a scanning electron microscope for observing a surface of the specimen exposing electrically conductive terminals on the specimen;
    stage means for supporting the specimen with an insulated environment in relation to the scanning electron microscope;
    imaging means for acquiring an image identifying conductive path indicia of the surface of the specimen from the scanning electron microscope;
    probe control means for remotely controlling a plurality of probes with said means for acquiring the image for conveying electrical test signals positionable on the surface of the specimen;
    vacuum chamber means for generating a vacuum in a chamber having an inner enclosure for housing the specimen; and
    feedthrough means for coupling electrical signals from said means for acquiring the image to said means for remotely controlling the plurality of probes via a feedthrough on the chamber, said imaging means communicating with said probe control means for remotely controlling the plurality of probes for applying electrical test signals to the terminals on the specimen using the acquired image to identify the electrically conductive terminals from the conductive path indicia of the surface of the specimen observed with the scanning electron microscope.

2. A system as recited in claim 1 wherein said stage means is coupled relative to a platen allowing raising and lowering of the plurality of probes facilitating viewing with said imaging means.

3. A system as recited in claim 1 wherein said imaging means for acquiring the image comprises a first computer.

4. A system as recited in claim 1 comprising a second computer, said probe control means for remotely controlling the plurality of probes comprises a motorized manipulator being remotely controlled by said second computer.

5. A system as recited in claim 3 wherein said probe control means for remotely controlling the plurality of probes comprises a motorized manipulator being remotely controlled by said first computer.

6. A system as recited in claim 3 wherein said specimen includes an integrated circuit wafer.

7. A probe station system for acquiring electrical test signals from an integrated circuit specimen, comprising:
    a scanning electron microscope positioned for observing a surface of the specimen exposing electrically conductive terminals on the specimen;
    a carrier for supporting the specimen with an insulated environment in relation to said scanning electron microscope;
    a computer for acquiring an image identifying conductive path indicia of the surface of the specimen from said scanning electron microscope;

a motorized manipulator being remotely controlled by said computer;

a plurality of probes for conveying electrical test signals positionable on the surface of the specimen with said motorized manipulator;

a vacuum chamber having an inner enclosure for housing said scanning electron microscope, said carrier, said motorized manipulator and said plurality of probes for analyzing said specimen in a vacuum; and a feedthrough on said vacuum chamber for coupling electrical signals from said computer to said motorized manipulator and said plurality of probes, said computer communicating with said motorized manipulator for positioning said plurality of probes for applying and receiving electrical test signals via the terminals on the specimen using the image acquired with said computer to identify the electrically conductive terminals from the conductive path indicia of the surface of the specimen observed with said scanning electron microscope.

8. A system as recited in claim 7 wherein said carrier comprises a shielded integrated circuit chuck for supporting a wafer specimen.

9. A system as recited in claim 7 wherein said carrier comprises a thermal chuck.

10. A system as recited in claim 7 wherein said computer for acquiring the image comprises a personal computer (PC).

11. A system as recited in claim 7 comprising a motorized platform coupled to said carrier, said platform providing translational tip and tilt movement of said carrier for device and probe viewing.

12. A system as recited in claim 7 wherein said computer comprises an image processor associated with said scanning electron microscope.

13. A system as recited in claim 7 wherein said computer is a general purpose personal computer.

14. A system as recited in claim 7 wherein said means for remotely controlling the plurality of probes comprises a motorized manipulator being remotely controlled by said personal computer.

15. A system as recited in claim 14 wherein said means for remotely controlling the plurality of probes comprises a multiplicity of motorized manipulators.

16. A system as recited in claim 7, wherein said plurality of probes comprises a fixed position probe card for applying electrical test signals to the specimen.

17. A method of analyzing an integrated circuit specimen, comprising the steps of:

positioning a scanning electron microscope for observing a surface of the specimen exposing electrically conductive terminals on the specimen;

supporting the specimen with an insulated environment in relation to the scanning electron microscope;

acquiring an image identifying conductive path indicia of the surface of the specimen from the scanning electron microscope;

remotely controlling a plurality of probes positionable on the surface of the specimen for conveying electrical test signals;

generating a vacuum in a chamber having an inner enclosure for housing the scanning electron microscope and the plurality of probes for analyzing the specimen in a vacuum; and coupling communication signals via a feedthrough on the chamber for applying electrical test signals to the terminals on the specimen using the image acquiring step to identify the electrically conductive terminals from the conductive path indicia of the surface of the specimen observed with the scanning electron microscope for positioning the plurality of probes with the step for remotely controlling the plurality of probes.

18. A method as recited in claim 17 wherein said step of acquiring the image provides a computer for acquiring the image identifying the conductive path indicia of the surface of the specimen using the scanning electron microscope.

19. A method as recited in claim 18 wherein said step of remotely controlling the plurality of probes uses the computer of said image acquiring step for controlling a motorized manipulator for remotely controlling the plurality of probes positionable on the surface of the specimen for conveying the electrical test signals to the specimen.

20. A method as recited in claim 19 comprising a step of providing a computer user interface for remotely controlling the plurality of probes with the computer for positioning the probes on the surface of the specimen.

* * * * *